United States Patent
Klodzinski

(10) Patent No.: US 6,664,594 B2
(45) Date of Patent: Dec. 16, 2003

(54) POWER MOS DEVICE WITH ASYMMETRICAL CHANNEL STRUCTURE FOR ENHANCED LINEAR OPERATION CAPABILITY

(75) Inventor: Stanley J. Klodzinski, Bend, OR (US)

(73) Assignee: Advanced Power Technology, Inc., Bend, OR (US)

(*) Notice: Subject to any disclaimer, the term of this patent is extended or adjusted under 35 U.S.C. 154(b) by 0 days.

(21) Appl. No.: 10/268,274

(22) Filed: Oct. 9, 2002

(65) Prior Publication Data

US 2003/0034522 A1 Feb. 20, 2003

Related U.S. Application Data

(62) Division of application No. 09/925,289, filed on Aug. 8, 2001, now Pat. No. 6,503,786.
(60) Provisional application No. 60/223,676, filed on Aug. 8, 2000.

(51) Int. Cl.[7] .................. H01L 29/76; H01L 29/94; H01L 31/062; H01L 31/113; H01L 31/119
(52) U.S. Cl. .................. 257/341; 257/391; 257/401
(58) Field of Search .................. 438/173, 174, 438/192, 194, 206, 209, 212, 217, 223, 286, 287; 257/341, 344, 345, 391, 392, 335, 401, 402, 403, 404

(56) References Cited

U.S. PATENT DOCUMENTS

| | | | |
|---|---|---|---|
| 4,665,423 A | | 5/1987 | Akiya |
| 4,895,810 A | | 1/1990 | Meyer et al. |
| 5,095,343 A | | 3/1992 | Klodzinski et al. |
| 5,262,336 A | | 11/1993 | Pike et al. |
| 5,479,037 A | * | 12/1995 | Hshieh et al. .............. 257/328 |
| 5,631,483 A | * | 5/1997 | Ferla et al. ................ 257/341 |
| 5,751,025 A | | 5/1998 | Heminger et al. .......... 257/173 |
| 5,894,139 A | | 4/1999 | Otsuki et al. .............. 257/139 |
| 6,008,518 A | | 12/1999 | Takahashi ................ 257/326 |
| 6,054,737 A | * | 4/2000 | Magri' et al. .............. 257/341 |
| 6,137,139 A | * | 10/2000 | Zeng et al. ................ 257/342 |
| 6,207,993 B1 | | 3/2001 | Ishimura et al. ............ 257/335 |
| 6,246,092 B1 | | 6/2001 | Fujihira et al. ............. 257/262 |
| 2002/0047140 A1 | | 4/2002 | Moller et al. |

FOREIGN PATENT DOCUMENTS

| WO | WO 02/07223 | 1/2002 | .......... H01L/27/088 |
|---|---|---|---|

OTHER PUBLICATIONS

Preliminary data sheet, APL501J, published Sep. 29, 1999, Advanced Power Technology, Inc. Bend, Oregon.
Evaluation Report, dated Aug. 9, 1999, TDI Transistor Devices, Dynaload Division, Randolph, New Jersey.
Frey, Richard; Grafham, Denis; and Mackewicz, Tom, "New 500V Linear MOSFETs for a 120 kW Active Load," Application Note, APT 2002, presented at Power Conversion and Intelligent Motion (PCIM) Conference, Nuremberg, Germany, Jun. 7, 2000.
Klodzinski, S., Aug. 9, 2000, transmittal memo with APT Sample requests and Order Entry dated Oct. 15, 1999 and first ship date Dec. 29, 1999, of Advanced Power Technology, Inc., Bend, Oregon.

* cited by examiner

*Primary Examiner*—Wael Fahmy
*Assistant Examiner*—Hoai Pham
(74) *Attorney, Agent, or Firm*—Marger Johnson & McCollom, P.C.

(57) ABSTRACT

A power MOSFET type device, which can include an IGBT or other VDMOS device having similar forward transfer characteristics, is formed with an asymmetrical channel, to produce different gate threshold voltage characteristics in different parts of the device. The different gate threshold voltage characteristics can be achieved either by different source region doping concentrations or different body region doping concentrations subjacent the gate oxide, or by asymmetrical gate oxide thicknesses. The portion of overall channel affected can be 50% or such other proportion as the designer chooses, to reduce the zero temperature coefficient point of the device and improve its Safe Operating Area in linear operation, while retaining low conduction loss. Multiple power MOSFET devices with asymmetrical channels can easily be used safely in parallel linear power amplifier circuits.

19 Claims, 12 Drawing Sheets

FIG. 2 Forward Transfer Characteristics of Typical MOSFET

FIG. 3 Forward Transfer Characteristics, a) Typical Device, b) 50% Channel Width FIG. 4 Forward Transfer Characteristics, a) Reference Device with 50% Channel Width, 50% Channel with Vth Reduced by b) -1V and c) -2V.

FIG. 5 Forward Transfer Characteristics, a) Typical Device, b) 50% Channel Vth Raised by +2V and c) 50% of Channel Width.

Forward Transfer Characteristics, a) Typical Device, b) 50% Channel Vth Raised by +2V and c) 50% of Channel Width (25 and 125 deg C).

Device With Symmetric Threshold Voltage      $N_{A1}=N_{A2}$
$N_{D1}=N_{D2}$

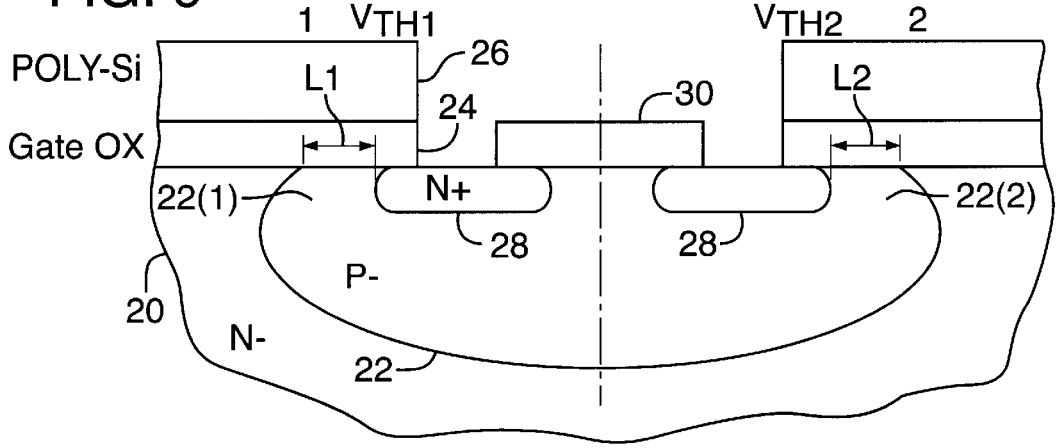
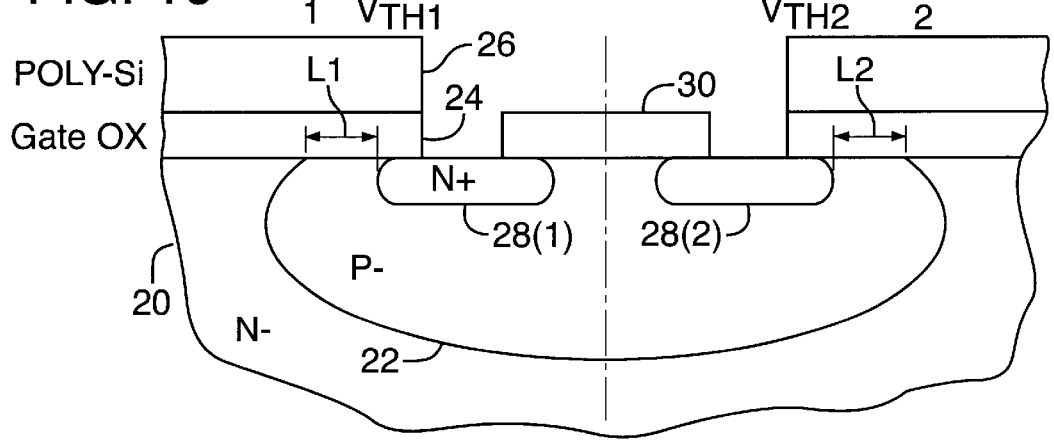
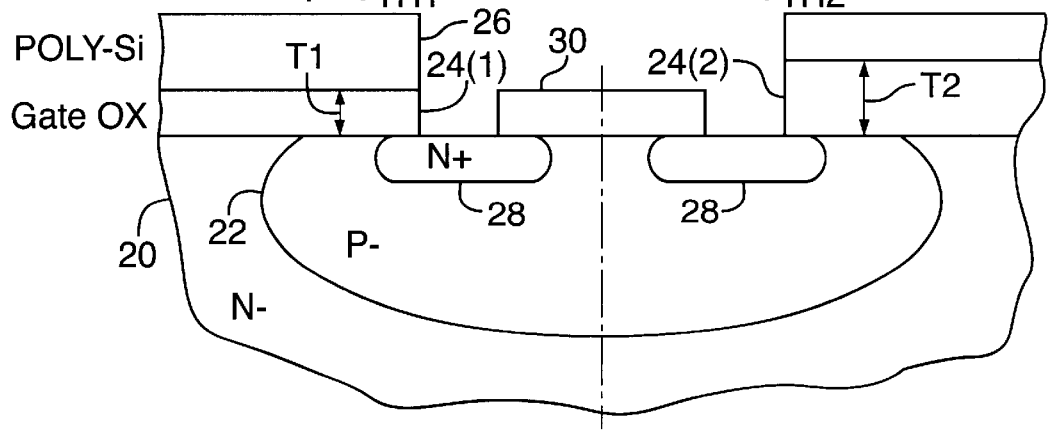

Typical FBSOA Curve

Paralleling several MOSFETS

POWER MOS DEVICE WITH ASYMMETRICAL CHANNEL STRUCTURE FOR ENHANCED LINEAR OPERATION CAPABILITY

RELATED APPLICATION DATA

This application is a divisional of U.S. application Ser. No. 09/925,289, filed Aug. 8, 2001, now U.S. Pat. No. 6,503,786, which claimed priority from U.S. Ser. No. 60/223,676, filed Aug. 8, 2000, incorporated by reference herein.

FIELD OF INVENTION

The present invention relates to improving the safe operating area (SOA) and the conduction loss of a power semiconductor device operating under "linear" operating conditions. The invention is couched in the terminology of a power metal-oxide-semiconductor field-effect transistor (MOSFET). The same principle applies to devices such as the IGBT (insulated gate bipolar transistor) having similar forward transfer characteristics.

BACKGROUND OF THE INVENTION

For simplicity, the following discussion employs symbols and structures appropriate for a vertical N-Channel double-diffused metal-oxide-semiconductor field-effect transistor (VDMOS). Parallel discussions and conclusions can be drawn for an IGBT by changing the starting material from an N+ type substrate to a P+ type substrate and by substituting the Emitter for the Drain and the Collector for the Source terminals. Similarly, appropriate changes in the polarity of the doping layers will be straightforward to those skilled in the art to apply the discussions to a P-Channel device. Examples of these devices and their manufacture are described in U.S. Pat. Nos. 4,895,810 and 5,262,336. Collectively, these devices can be referred to generically as power MOSFET-type devices.

Commercial VDMOS devices are fabricated using high temperature oxidation, deposition and diffusion processes to create distinctive N– drain, P-body and N+ source regions. The N– drain region and the N+ source region are spaced apart by the P-body region and form with it two back-to-back PN diodes which normally would inhibit current flow from drain to source. If a gate oxide is grown over the P-body region and an electrode is placed insulatively thereupon so as not to electrically short the underlying diffusions and to overlap the body, drain and source diffusions, an N-type conducting channel can be created by field effect through appropriate bias applied to the gate electrode to change the surface of the P-body region into n-type, thereby allowing current to flow in the presence of a drain-source bias. When this gate bias is removed, the surface channel reverts back to P-type and current flow is stopped. A simplified mathematical expression which describes the interaction between the gate voltage and the current flowing from drain to source is given below:

$$I = \epsilon \mu W (V_{GS} - V_{TH})^2 / (2L\, t_{OX}) \quad (1)$$

The transconductance, defined as the rate of change of forward current with gate bias is then, $$Gm = d\,I/d\,V_{GS} = \epsilon \mu W (V_{GS} - V_{TH}) / (L\, t_{OX}) \quad (2)$$

where the symbols carry their traditional meanings: $\epsilon$, permitivity; $\mu$, carrier mobility; W, channel width; L, channel length; $t_{OX}$, gate oxide thickness; $V_{GS}$, gate-source applied voltage; $V_{TH}$, threshold voltage for surface inversion; T, temperature; and $G_m$, the transconductance. W, L and $t_{OX}$ are affixed by design and process and are invariant with operating temperature, while carrier mobility $\mu$ and threshold voltage $V_{TH}$ are monotonically-decreasing functions of temperature. A representative threshold voltage vs. temperature curve calculated for a 1000 Å gate oxide is shown in FIG. 1. This temperature dependence of the threshold voltage is a key cause for instability when operating a given MOSFET at certain currents.

Empirically, mobility has been shown to follow temperature to the (−1.7) power. The combined dependence on temperature by threshold and mobility leads to forward transfer characteristic graphs showing the dependence of device drain-source current ID on the gate—source bias voltage $V_{GS}$. One such typical curve is shown in FIG. 2 for a commercial VDMOS, APT5020BVR in this case. This graph shows a device user how much current can be expected to flow through the MOSFET at a given gate voltage. The current is plotted at three different temperatures vs. gate voltage. Note that the transconductance, which is the slope of this curve, decreases with temperature. The curves formed at different temperatures are shown here to crisscross through a single point. This point is sometimes referred to as the "zero temperature coefficient point" (ZTCP). The current increases with temperature below this point and decreases with temperature above this point. Device operation above this ZTCP point is thermally stable while below this point operation is not thermally stable.

Instability to operation below the ZTCP point can be understood in the following simplified explanation: When operated below the ZTCP point, if a local region due to any processing or packaging inhomogeneity gets hot, the threshold voltage will drop as shown in FIG. 1. As the threshold voltage drops, a stronger gate drive or larger difference in the $(V_{GS} - V_{th})$ term in Eq. 1 develops, causing the current to rise. This rising current generates more heat in the local region, which further drives down the threshold voltage. Thus, a positive feedback loop develops, which if unchecked, can cause hot spotting and eventual device failure.

Traditionally, commercial VDMOS are designed with high packing density to minimize resistance per unit area. As such, the current that could be made to flow and the power thus generated far exceeds the heat-dissipative capability of the silicon. Application of the VDMOS transistor as Class A, Class B or Class AB linear amplifiers has shown a propensity for thermal instability and raised concerns for suitability of VDMOS as linear amplifiers.

A prior art solution enabling the VDMOS devices to operate as linear amplifiers is to reduce the packing density of the silicon while maintaining the device size for heat dissipative capability. A common practice, such as described in U.S. Pat. No. 5,095,343, is to eliminate part of the channel from conducting current through eliminating some of the N+ source diffusions shown in FIGS. 3 and 4 in the said patent. FIG. 7 shows a conventional VDMOS device with a symmetrical channel. FIG. 8 shows such a device in which the N+ diffusion is eliminated on one side of the device. By so doing, the transconductance is reduced and, with it, the current level of the ZTCP point. Using this reduced channel device in the same application would effectively mean operation closer to the ZTCP point where current variance due to temperature fluctuation is substantially reduced. A device so created, though superior in linear operation, pays a penalty of higher conduction loss due to increase in on-state resistance for the same operating current.

Accordingly, a need remains for a way to achieve linear operation of a VDMOS transistor and other power MOSFET devices while retaining the advantage of low conduction loss.

SUMMARY OF THE INVENTION

It is, therefore, an object of the invention to achieve linear operation in power MOSFET type devices while keeping conduction loss low.

One aspect of the invention is a power device in which a portion of the channel has a threshold voltage characteristic that is different from the threshold voltage characteristic of the remainder of the channel. Such a power MOSFET type device achieves linear operation while keeping conduction loss low. An advantage of such a device is that it provides a forward biased safe operating area (FBSOA) higher than a conventional switch mode device of the same design with symmetric threshold characteristics.

A power MOSFET type device according to the invention comprises a substrate of a first dopant type and first and second gate structures disposed on a surface of the substrate and spaced apart thereon. A body region of a second dopant type is formed in the substrate and has first and second spaced-apart channel regions respectively disposed subjacent the first and second gate structures. First and second source regions of the first dopant type are formed in the body region, The first and second channel regions are formed so as to have different gate threshold voltage characteristics.

Preferably, the first channel region has a gate threshold voltage characteristic sufficiently different from the gate threshold voltage characteristic of the second channel region to reduce zero temperature coefficient point (ZTCP) relative to a device of otherwise similar structure having a single gate threshold voltage characteristic. Also, different proportions of the channel can have different gate threshold voltage characteristics. Manipulating these proportions makes it possible to reduce variation in transconductance of the device as a function of temperature relative to a device having a single gate threshold voltage characteristic.

Another aspect of the invention is a method for producing an asymmetric threshold characteristic in MOSFET-type devices, including IGBT devices.

Various methods can be used to form the first and second channel regions so as to have different gate threshold voltage characteristics. One way is to differentially dope the first and second channel regions so that the first channel region has a doping concentration less than a doping concentration of the second channel region. Another is to differentially dope the first and second source regions so that the first source region has a doping concentration greater than a doping concentration of the second source region. Another is to vary the thicknesses of the dielectric layer of the gate structures so that the dielectric layer of the first gate structure has a thickness less than a thickness of the dielectric of the second gate structure.

The foregoing and other objects, features and advantages of the invention will become more readily apparent from the following detailed description of a preferred embodiment of the invention, which proceeds with reference to the accompanying drawings.

BRIEF DESCRIPTION OF THE DRAWINGS

FIG. 9 is a cross-sectional view of a VDMOS device with an asymmetric channel doping arrangement producing an asymmetrical threshold voltage characteristic according to a first embodiment of the invention.

FIG. 10 is a cross-sectional view of a VDMOS device with an asymmetric source doping arrangement producing an asymmetrical threshold voltage characteristic according to a second embodiment of the invention.

FIG. 11 is a cross-sectional view of a VDMOS device with an asymmetric gate oxide thickness producing an asymmetrical threshold voltage characteristic according to a third embodiment of the invention.

DETAILED DESCRIPTION

Figure 7:
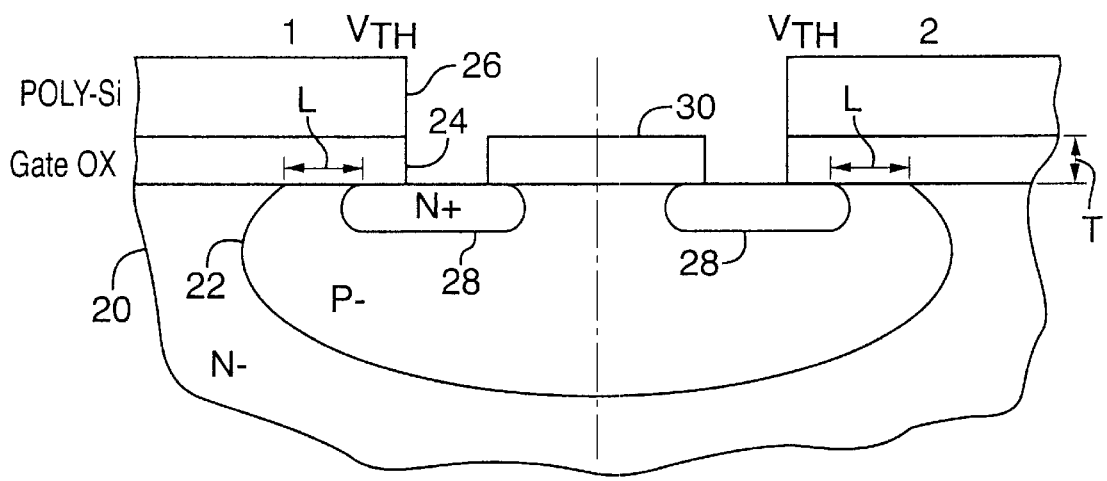
FIG. 7 is a cross-sectional view of a conventional VDMOS device with a symmetrical threshold voltage characteristic.

FIG. 7 is a cross-sectional view of a portion of a conventional VDMOS device with a symmetrical threshold voltage characteristic, as discussed above with reference to FIG. 2. This structure includes a substrate region 20 (which can include an epitaxial layer, not shown) which is doped to a first dopant type, e.g., N−, indicating a lightly N-doped drain region. A body region 22 is implanted and diffused into the substrate with an opposite polarity dopant; e.g., P−, indicating a lightly P-doped region. A gate oxide layer 24 covered by a suitable conductive material such as polysilicon layer 26 covers the upper substrate surface. An opening is formed in the gate oxide and conductive layers over the P-body region 22. Source regions 28 are symmetrically positioned within the P-body region 22 and contacted by a source conductive layer 30. This structure may be fabricated using a wide range of processes, commonly employing self-alignment techniques and diffusion processes that inherently attain substantial symmetry about the centerline C/L of the portion of the device. In this structure, doping concentration $N_{A1}=N_{A2}$, where NA is the concentration of acceptor atoms in the channel (P−) region. Similarly $N_{D1}=N_{D2}$, where ND is the concentration of donor atoms in the source (N+) region. In addition, the channel lengths L and gate oxide thicknesses T on each side of the device are substantially equal.

Figure 3:
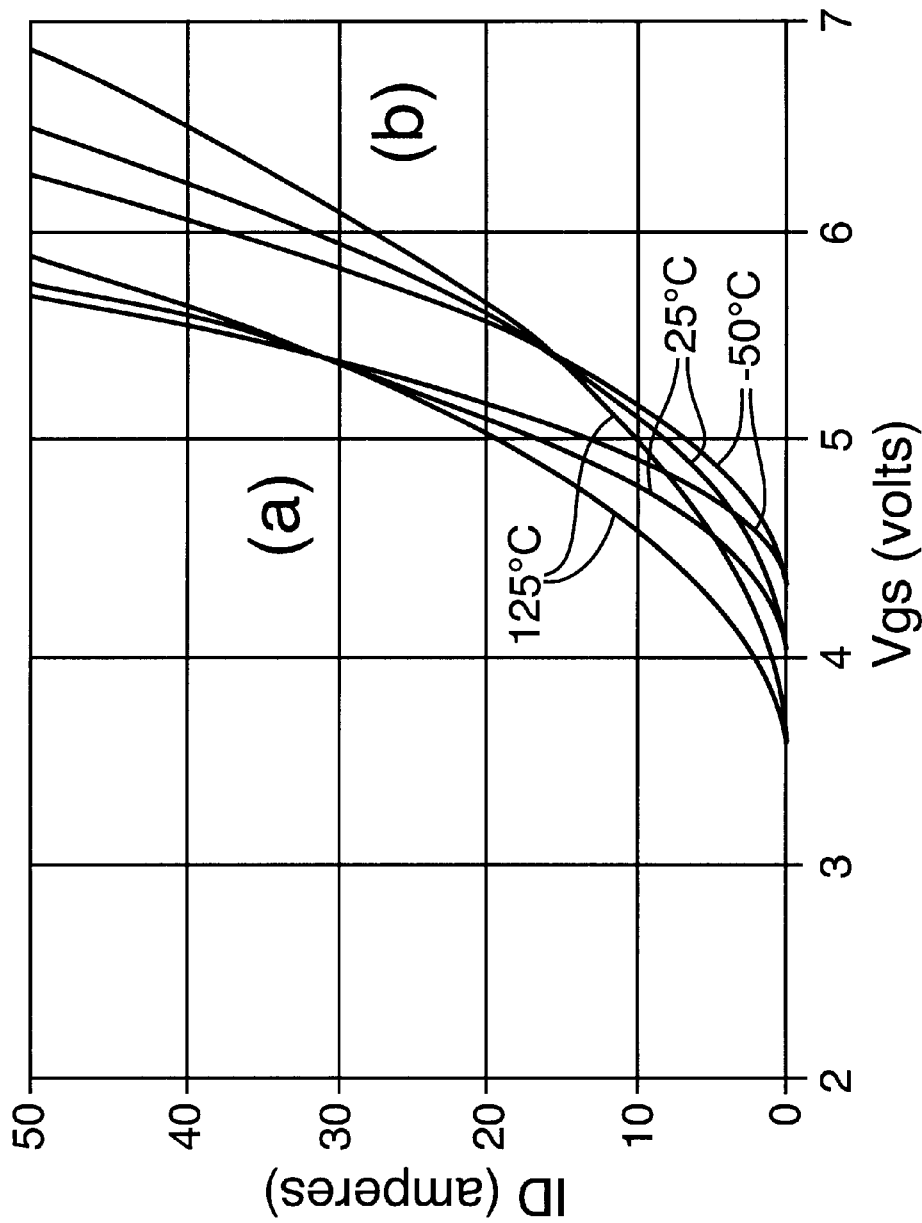
FIG. 3 is a graph of forward transfer characteristics, plotted at three different temperatures, for (a) a typical power MOSFET and (b) a similar device with half of the channel width eliminated.
Figure 8:
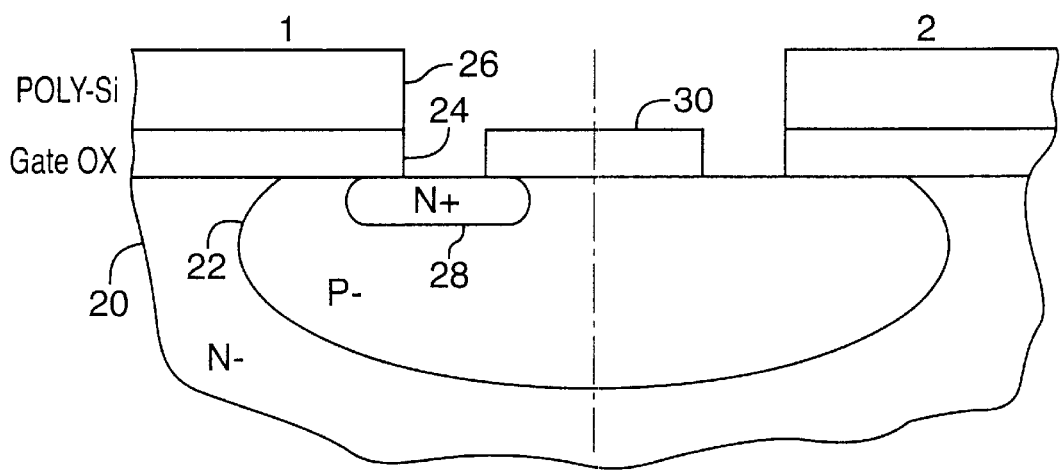
FIG. 8 is a cross-sectional view of a conventional VDMOS device with half of its channel eliminated.

FIG. 8 is a cross-sectional view of a conventional VDMOS device similar to that of FIG. 7 but with half of its channel eliminated. FIG. 3 shows the effect of eliminating one-half of the channel width from a given VDMOS device. The ZTCP point shown in curve (b) for the device in FIG. 8 is seen to have dropped to one-half that of the device shown by curve (a) for the device in FIG. 7.

FIGS. 9, 10 and 11 each show embodiments of devices according to the invention, which have a channel on both sides of the gate window but have an asymmetric threshold voltage characteristic. Before discussing the structures and methods for making the different embodiments, however, it is useful to discuss the effects and advantages of having an asymmetric threshold voltage characteristic.

Figure 4:
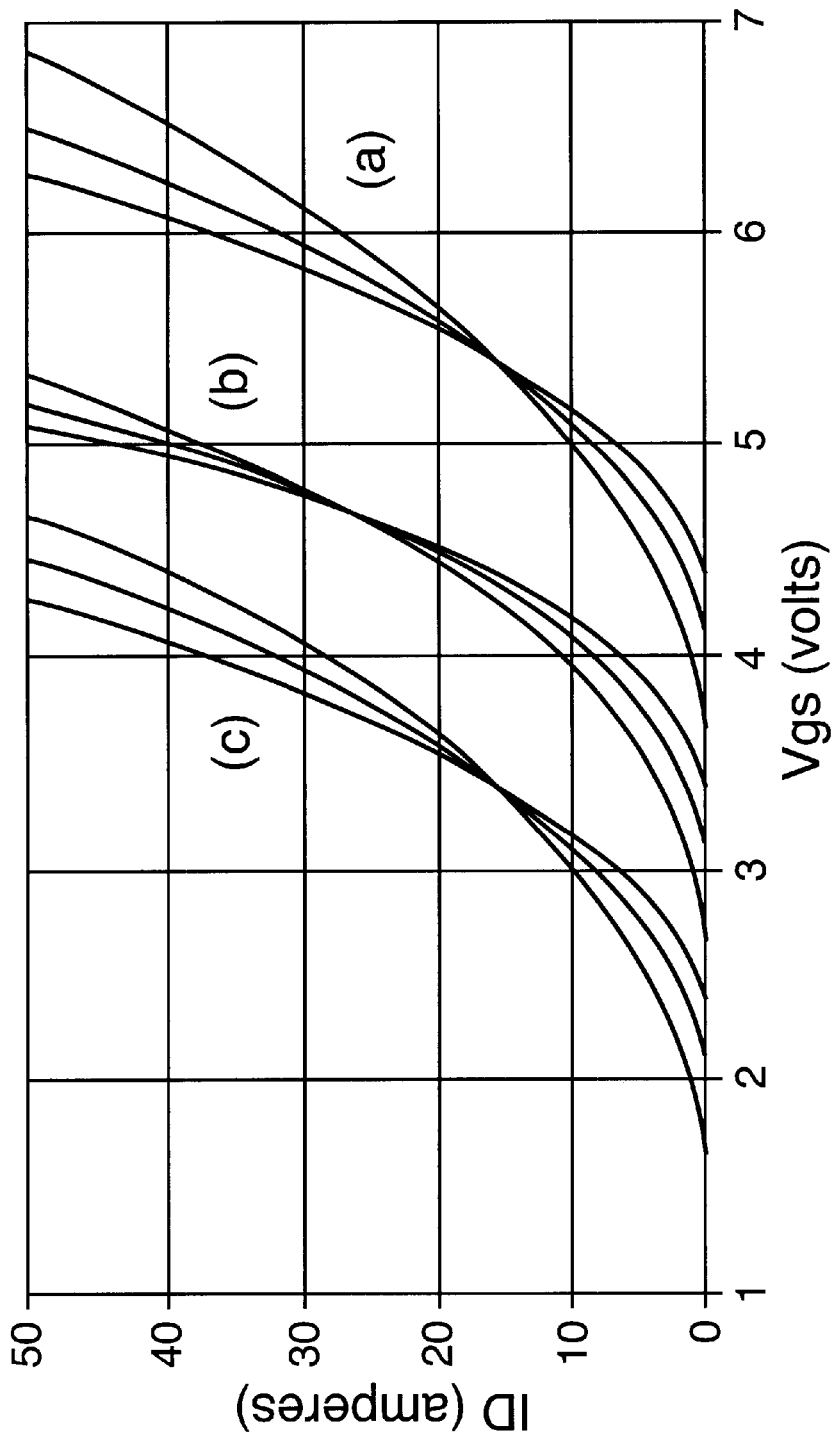
FIG. 4 is a graph of forward transfer characteristics similar to FIG. 3, showing the different characteristics produced by reducing threshold voltage in half of the channel in contrast to eliminating half the channel width.

FIG. 4 illustrates what happens if, instead of eliminating the channel, a threshold voltage difference is created in a given device. Curve (a) is a reference curve for the same device (b) shown in FIG. 3, for which one half of the conduction channel has been eliminated. Curve (b) of FIG. 4 is for a device having the same channel width as device (a) in FIG. 3 but with one-half of the channel having a threshold voltage that is lower by 1.0V volt than the other half of the device. Curve (c) in FIG. 4 is for a device having the same total channel width as device (a) in FIG. 3 but with one-half of the device channel having a threshold voltage that is lower by 2.0 volts than the rest of the device.

It can be seen in FIG. 4 that, as asymmetry is created in a device to force difference in the conduction of regions of a device, the ZTCP point drops. The same ZTCP point has been reached in device (c) of FIG. 4 as device (a) in the same figure. The advantage is that the entire device is conducting and maintaining a low conduction loss at the same gate bias. We have thus created the desired condition to lower the ZTCP point while minimizing the disadvantage of the prior art.

Figure 5:
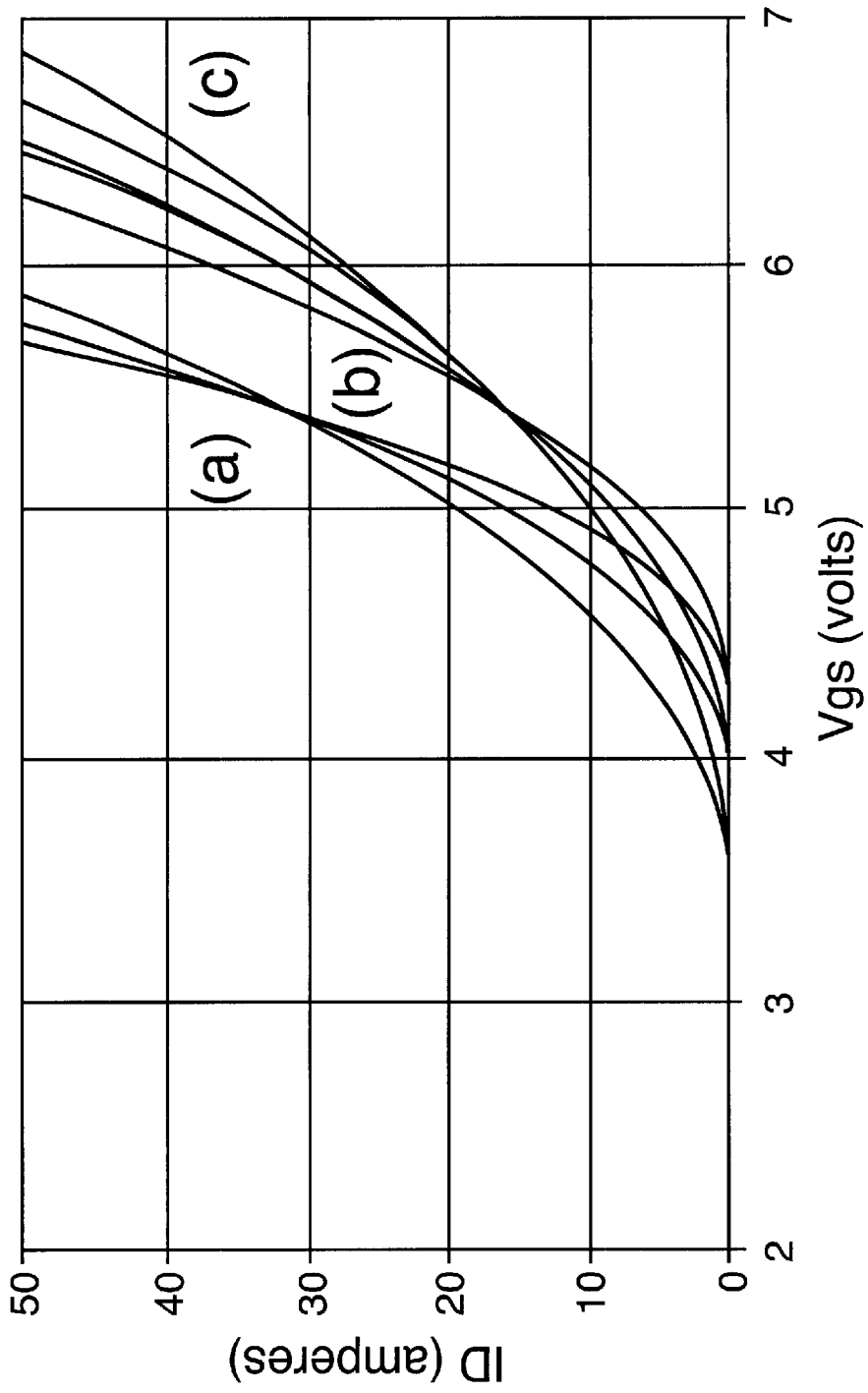
FIG. 5 is a graph of forward transfer characteristics similar to FIG. 4, showing the different characteristics produced by increasing threshold voltage in half of the channel in device (b) in comparison to a typical symmetrical device (a) and device (c) eliminating half the channel width. (Note: curves (b) and (c) nearly overlap each other.)
Figure 6:
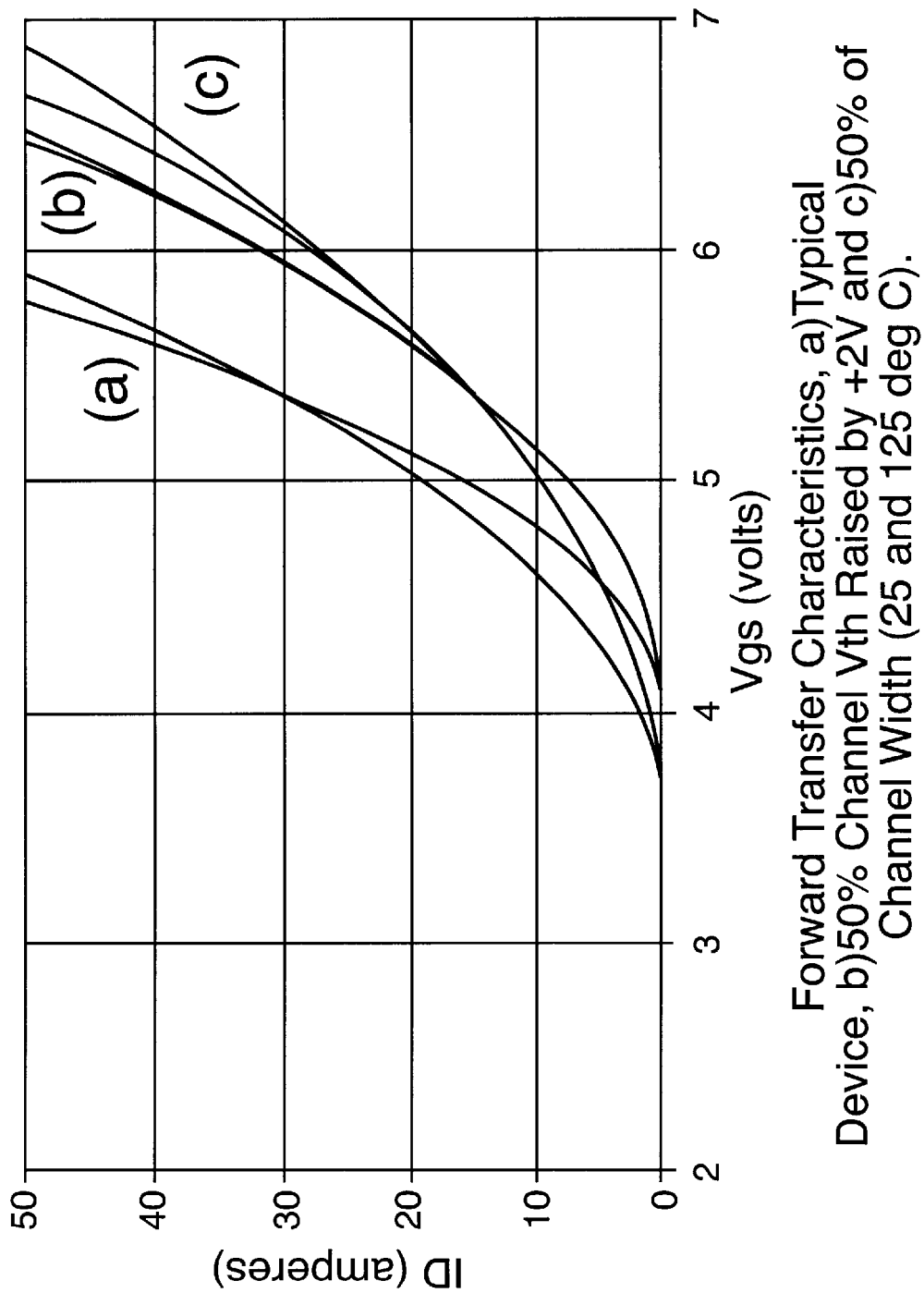
FIG. 6 is a graph of forward transfer characteristics similar to FIG. 5 but omitting the curves for −50° C.

FIG. 5 shows a similar plot where the asymmetry in channel threshold is moved in the other direction, i.e., instead of having one-half of the channel having a 2.0-volt lower threshold, now one-half of the channel has a 2.0-volt higher threshold. The ZTCP point for threshold-altered device curve (b) falls almost entirely on top of the curve (c) for the device having only 50% of the total channel width, with the exception that more current can conduct above the ZTCP point for the new device (b) at the same gate voltage. FIG. 6 is the same as FIG. 5 but is made simpler by eliminating the curves for −50 degrees Celsius.

It is clear that the conduction of the asymmetrical device is superior to the reduced channel width device. The device with one-half channel having 2.0V lower threshold voltage (FIG. 4, curve (c)) certainly has the best conduction. The device of FIG. 6, curve (b) on the other-hand has better noise immunity. Depending on the application, both can be useful. The analysis shows 2V to be a benchmark value for creating the desired ZTCP point. This value is contingent upon the constraints given by the gate oxide thickness, nature of the gate oxide, the background doping concentrations and other factors in the analysis. All of these are variables that the person skilled in the art can readily vary for different device structures and characteristics. It is important to understand that the principle illustrated is of the most importance in this invention and not the specific numbers deduced through the examples.

When sufficient asymmetry in threshold voltage is created, any of a variety of combinations of ZTCP point and forward conduction can be achieved. We have illustrated the principle by using only 50% of the channel and only two threshold voltages. This partitioning is only arbitrary and for ease of illustration and need not be so restricted. Depending on the application, various ratios of channel width and threshold voltage combinations can be created to achieve desired ZTCP point and conduction, as further discussed below.

Any of a number of methods can be used to create the desired asymmetry in the VDMOS. It also should be pointed out that the principle described here has general applicability regardless of the geometry of the device layout. It may be applied to both 1) cellular gate-source geometry such as shown in U.S. Pat. No. 5,095,343 as well as devices employing 2) interdigitated gate-source stripes (e.g. U.S. Pat. Nos. 4,895,810 and 5,262,336). The methods described below to create such asymmetry should be straight-forward to those skilled in the art. For example, by implanting the body dopant in case (2) at a tilt angle between 5 to 45 degrees in a direction which exposes one edge along the source stripe, while shielding the opposite edge of the same source stripe from the implant followed by high temperature diffusion, can create such an asymmetry. Implanting through a mask to a first body dose, removing the mask and implanting an additional body dose followed with diffusion can create a difference in junction depth and threshold asymmetry. Other methods such as creating regions with different gate oxide thickness or gate electrode material to modify the threshold voltage can also be employed. Other methods and approaches may be used to partition a device, create and design threshold asymmetry which falls within the scope of this invention. We claim such and all extensions of the present invention.

FIGS. 9, 10 and 11 show examples of device structures that provide the asymmetric threshold characteristic of the present invention in different ways. In general, the structure of each example can be similar to that of the conventional device of FIG. 7 and to the extent of that similarity, the same reference numerals are used. In the embodiment of FIG. 9, device with asymmetric channel (P−) doping, $N_{A1}<N_{A2}$ and $N_{D1}=N_{D2}$. In other words, the doping concentrations of the source regions are the same but the doping concentrations in the channel regions adjoining the gate oxide layer in the body region 22, designated 22(1) for the channel region of concentration $N_{A1}$ and 22(2) for the channel region of concentration $N_{A2}$, are different. Examples of techniques that can be used to accomplish this are as follows:

1) The channel is implanted in two installments. The first implant is introduced to both sides of the structure. Using photomasking techniques, a second implant dose is introduced to only one side of the structure. In FIG. 9, the second implant dose was masked (blocked) from Side 1.

2) The channel was implanted at an off-angle, resulting in a shadowing effect from the polysilicon 26 on one side of the structure. In FIG. 9, the implant channel dose was shadowed (lowered) on Side 1.

The lower charge and shorter channel on Side 1 result in a lower threshold voltage than in Side 2.

In the embodiment of FIG. 10, device with asymmetric source (N+) doping, $N_{A1}=N_{A2}$ and $N_{D1}>N_{D2}$. In other words, the doping concentrations of the channel regions adjoining the gate oxide layer in the body region 22 are the same but the doping concentrations in the source regions, designated 28(1) for the source region of concentration $N_{D1}$ and 28(2) for the source region of concentration $N_{D2}$, are different. One way to accomplish this result is by implanting the source in two installments. The first source implant is introduced to both sides of the structure. Using photomasking techniques, a second implant dose is introduced to only one side of the structure. In FIG. 10, the second implant dose was masked (blocked) from Side 2. The resultant longer channel on Side 2 has a higher threshold voltage than side 1.

In the embodiment of FIG. 11, device with asymmetric gate oxide, $N_{A1}=N_{A2}$ and $N_{D1}=N_{D2}$, but the gate oxide thicknesses over the two different parts of the channel are different. Thus, on the left side of the device shown in FIG. 11, gate oxide layer 24(1) has a thickness T1<T2, the thickness of gate oxide layer 24(2) on the right side of FIG. 11. One way to accomplish this is by growing an initial layer of gate oxide, followed by a photomasking procedure to protect one side of the structure. The gate oxide on the unprotected side of the structure is then etched down to a predetermined level of thickness. In FIG. 11, the thicker gate oxide above the channel on Side 2 results in Side 2 having a higher threshold voltage than Side 1.

For all the methods described above which require photomasking to achieve threshold voltage, the percent of the active area affected by the asymmetry can be adjusted to achieve various degrees of Safe Operating Area (SOA) capability improvement.

Figure 14:
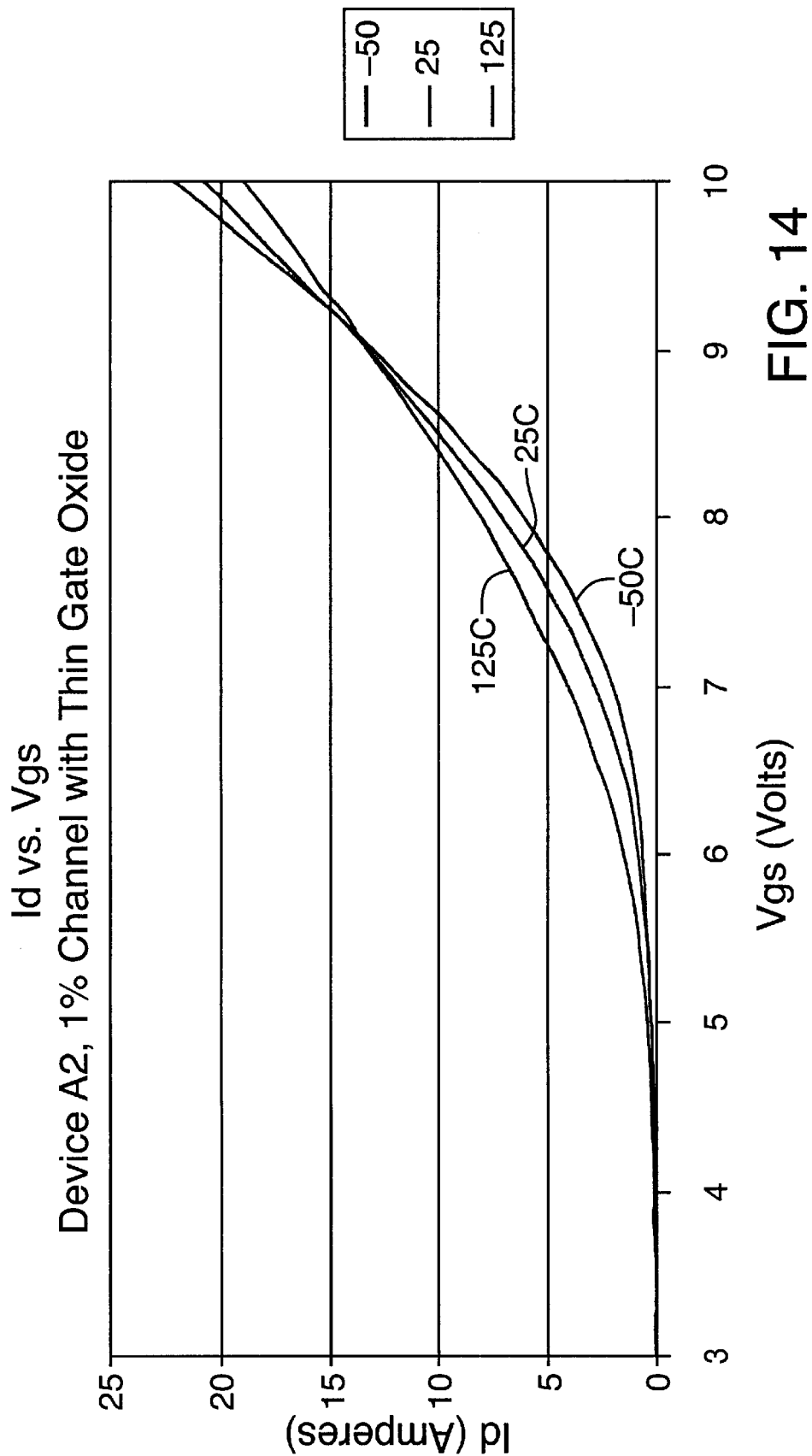
FIGS. 14, 15 and 16 are graphs of forward transfer characteristics similar to FIG. 4, showing the different characteristics produced by reducing threshold voltage in different proportions of the channel by forming one percent, five percent and 10 percent, respectively, with thin-gate oxide.
Figure 15:
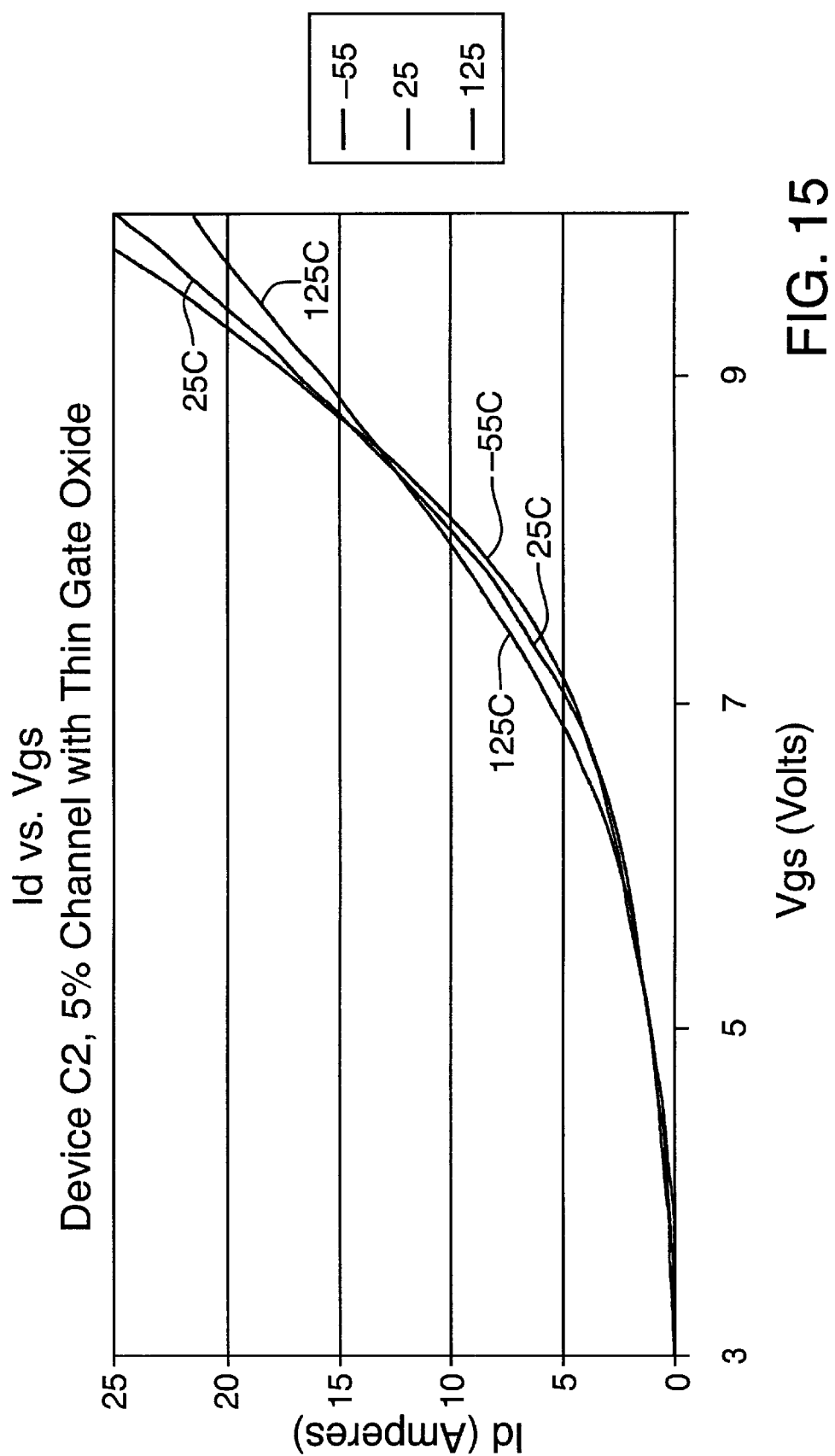
Figure 16:
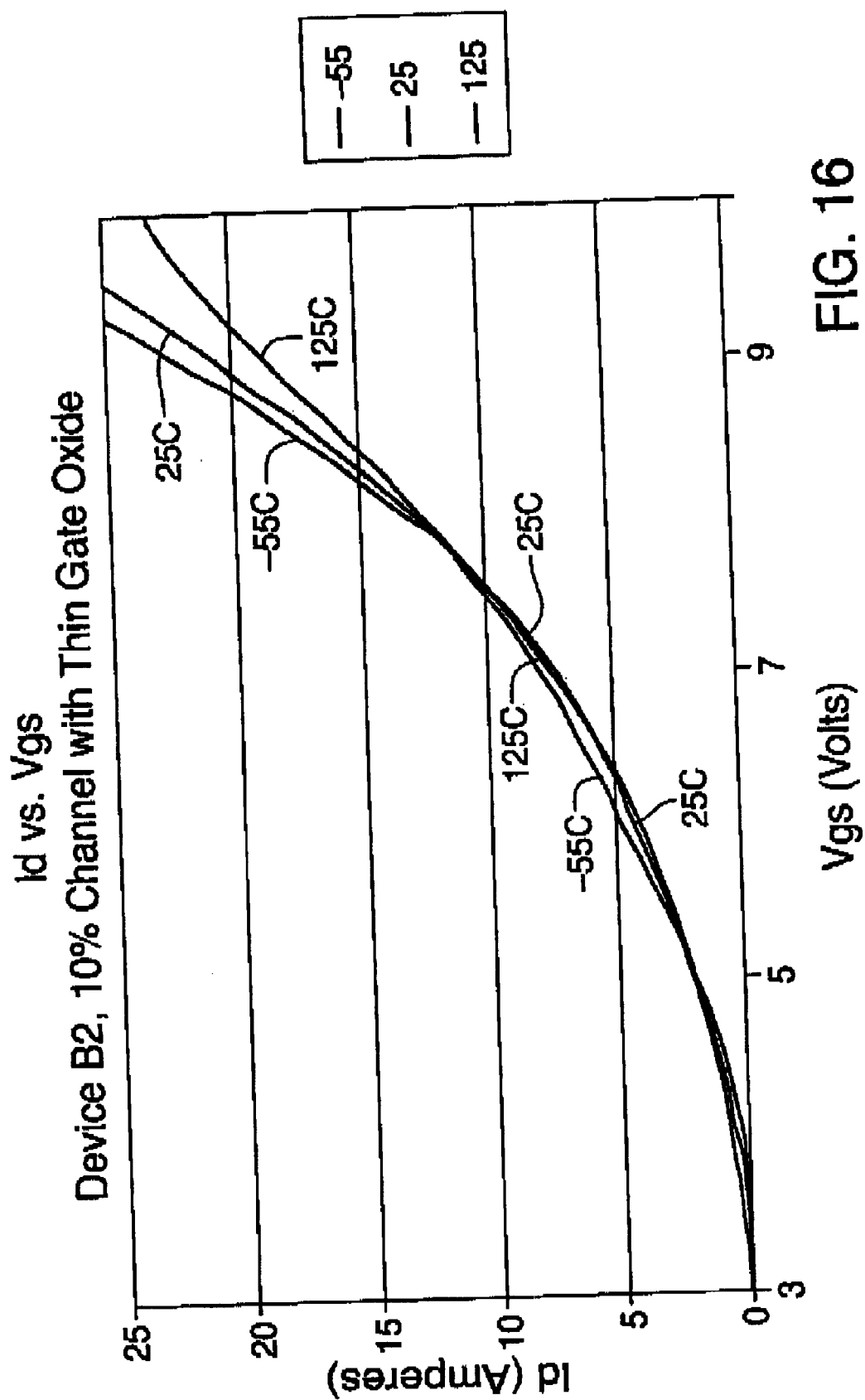

Variation in transconductance $G_m$ as a function of temperature can also be manipulated by varying the proportion of channel affected by the asymmetry. This is illustrated in FIGS. 14, 15 and 16. In FIG. 14, one percent of the channel is formed with a thin-gate oxide while ninety-nine percent is formed with a thicker gate oxide. In FIG. 15, the proportion of channel with thin-gate oxide is increased to five percent and in FIG. 16, it is increased to ten percent. Not only does the ZTCP move to successively lower currents, but the conductivity curves below the ZTCP move closer together. This shows that varying the proportions of assymetry of the channel can be used to vary the conductivity characteristics to make the device more resistant to temperature changes. Put another way, manipulating the gate threshold voltage characteristic in different proportions of the channel regions can be used to reduce variation in transconductance of the device as a function of temperature relative to a device of like structure having a single gate threshold voltage characteristic.

The foregoing are examples of ways the invention can be embodied in physical devices. Combinations of the foregoing methods can be used together. It should be apparent that the diagrams are simplified to show the general principles of the invention and its implementation. As mentioned above, the invention can be employed in the various device geometries and in devices that are formed in part by trenching into or buildup from a planar substrate surface, as well as by a variety of fabrication processes.

The following section further describes the advantages of the above-described device and ways that the device can be used in linear power circuits. Power MOSFETS are generally designed as switches. Total power dissipation is the sum of "on" state losses $I_{d2} \times R_{ds(on)}$ plus losses generated during very short switching intervals. Desirable characteristics include the lowest possible ON resistance, high breakdown voltage, very high gain ($g_{fs}$ or $G_m$), minimum switching losses, and a very low gate threshold voltage, $V_{GS(th)}$.

Figure 12:
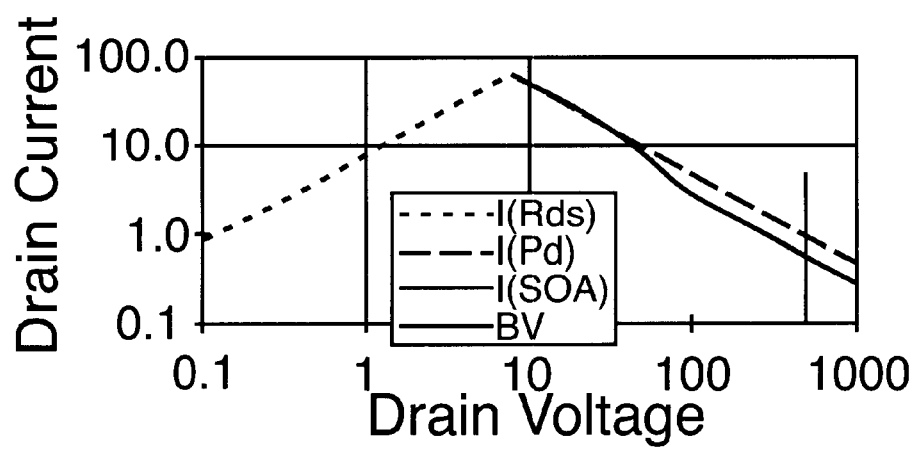
FIG. 12 is a diagram of a typical forward biased safe operating region.

Forward Biased Safe Operating Area (FBSOA) ratings are not important in switchmode operation, so the typical designer working in this area does not care. Such is not the case, however, among those engineers constrained to use these devices in "linear mode," where significant and concurrent values of drain voltage and current produce very high internal power dissipation. Forward Biased Safe Operating Area (FBSOA), or just SOA for linear devices, is a triangular area bounded on the left side by a positive sloped line defined by the $R_{ds(on)}$ of the device, and on the right side by a negative slope line determined by the power dissipation of the device, as shown in FIG. 12.

In the case of switchmode devices, FBSOA is of little importance. The device is operated between two points on the diagram, one on the $R_{ds}$ line and one off the chart at the same voltage and zero current. Power dissipation in a switched application is the sum of the on-loss, $I_{d2} \times R_{ds(on)}$, and the dynamic switching losses which occur while making the transition between two operating points. The characteristics that concern a switchmode designer are the $R_{ds(on)}$ characteristic and the parameters that determine the dynamic losses.

Linear operation is different. The device is operated in a non-saturated mode, away from the $R_{ds(on)}$ line and somewhere within the SOA. In this mode, the device behaves as a gate-controlled current source, which enables it to be used as a programmable active load.

Linear operation of a MOSFET cannot be reliably accomplished without negative feedback. Whether used as a "programmable current source" in an active load or as a control element in a linear series regulator, the device must always be in a control loop. Within such a loop, thermal variations of $V_{th}$ and $G_m$ can be accommodated.

Figure 13:
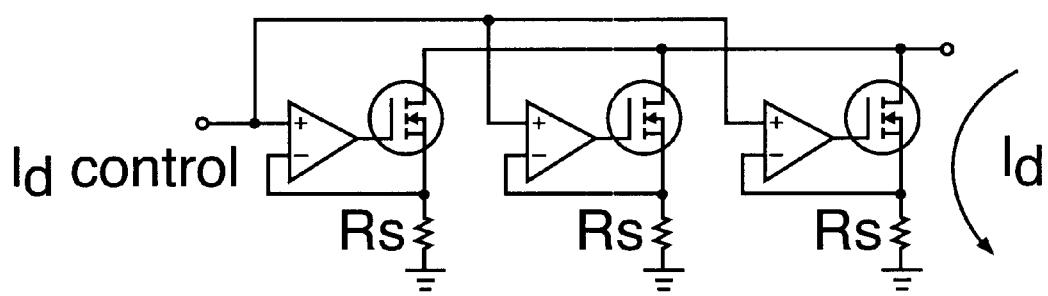
FIG. 13 is an example of a feedback circuit paralleling several MOSFETs for linear operation according to the invention.

Some applications require that MOSFET devices of a given power rating be paralleled. No matter how carefully devices are matched for a given characteristic, such as $G_m$, differences in other parameters and variations in mechanical assembly will conspire to unbalance paralleled devices. Some form of feedback control is necessary to assure current sharing. The easiest way to do this is to install source resistors to monitor the drain current of each MOSFET. A typical parallel arrangement is shown in FIG. 13. Resistor tolerances then monitor the relative matching between MOSFETs. The resulting resistor voltages are applied to the inverting inputs of operational amplifiers driving the gates, the non-inverting inputs being ties to a current-dependent reference voltage.

The value of the source resistor depends on the dynamic range of adjustment required, the noise content in the output, the minimum load resistance and the stability requirements of the system. A resistor $R_s$ outputting 1 to 2 volts is, preferred. The temperature coefficient of the resistors will determine the temperature stability of the system. Since the feedback is unique to each device, any number of MOSFETs can be paralleled without risk. The same current dependent reference voltage can be applied to all the op-amps.

Figure 1:
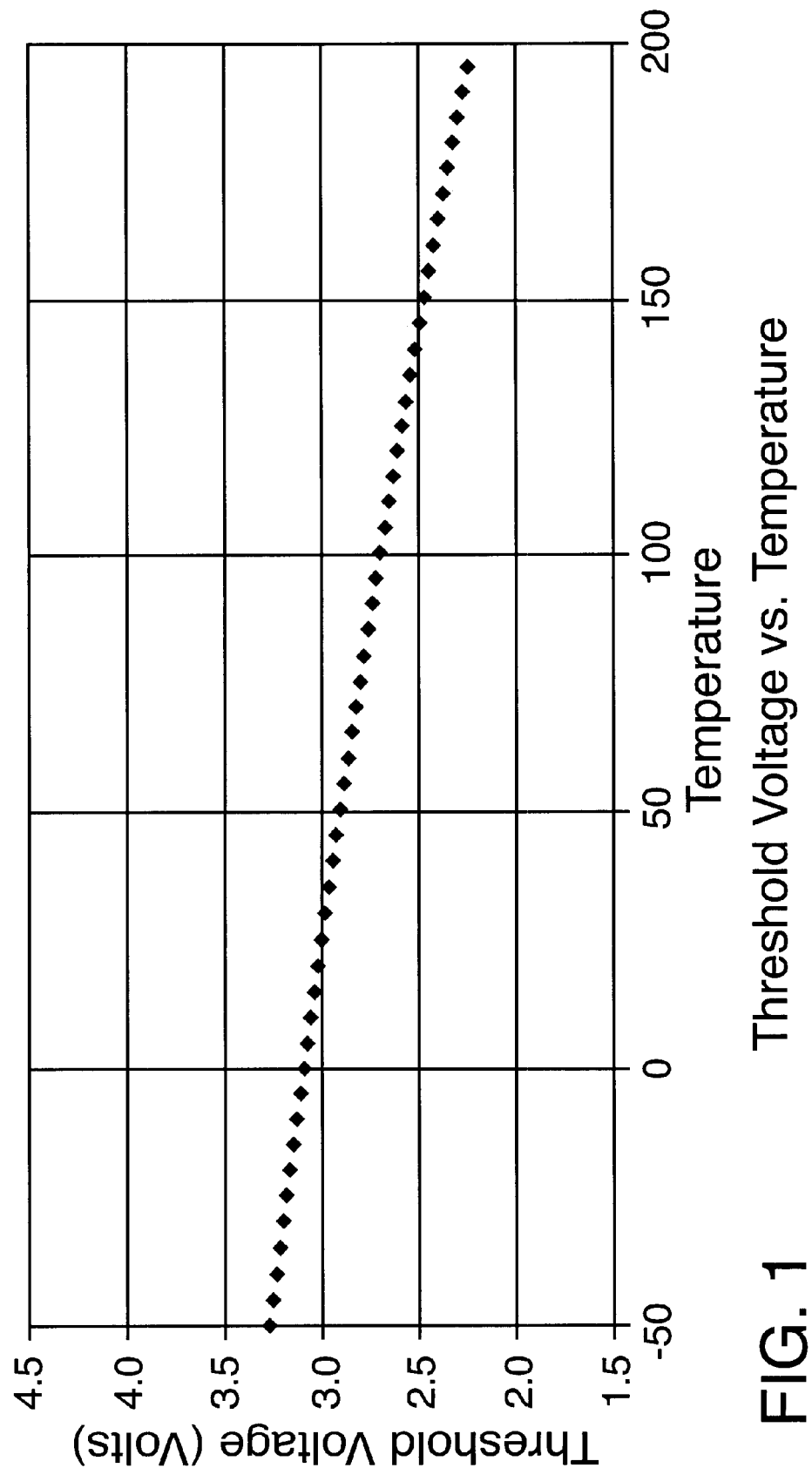
FIG. 1 is a representative threshold voltage vs temperature curve.

The present invention enables users to have substantially increased power dissipation in the linear mode. As mentioned above, the fundamental mechanism behind MOSFET FBSOA failures is localized thermal runaway caused by hot-spotting. It results from the interaction between non-uniform heating over the surface of the die and the negative coefficient of gate threshold voltage, as shown in FIG. 1. The phenomenon can be viewed as a classic example of an unstable feedback loop.

Figure 2:
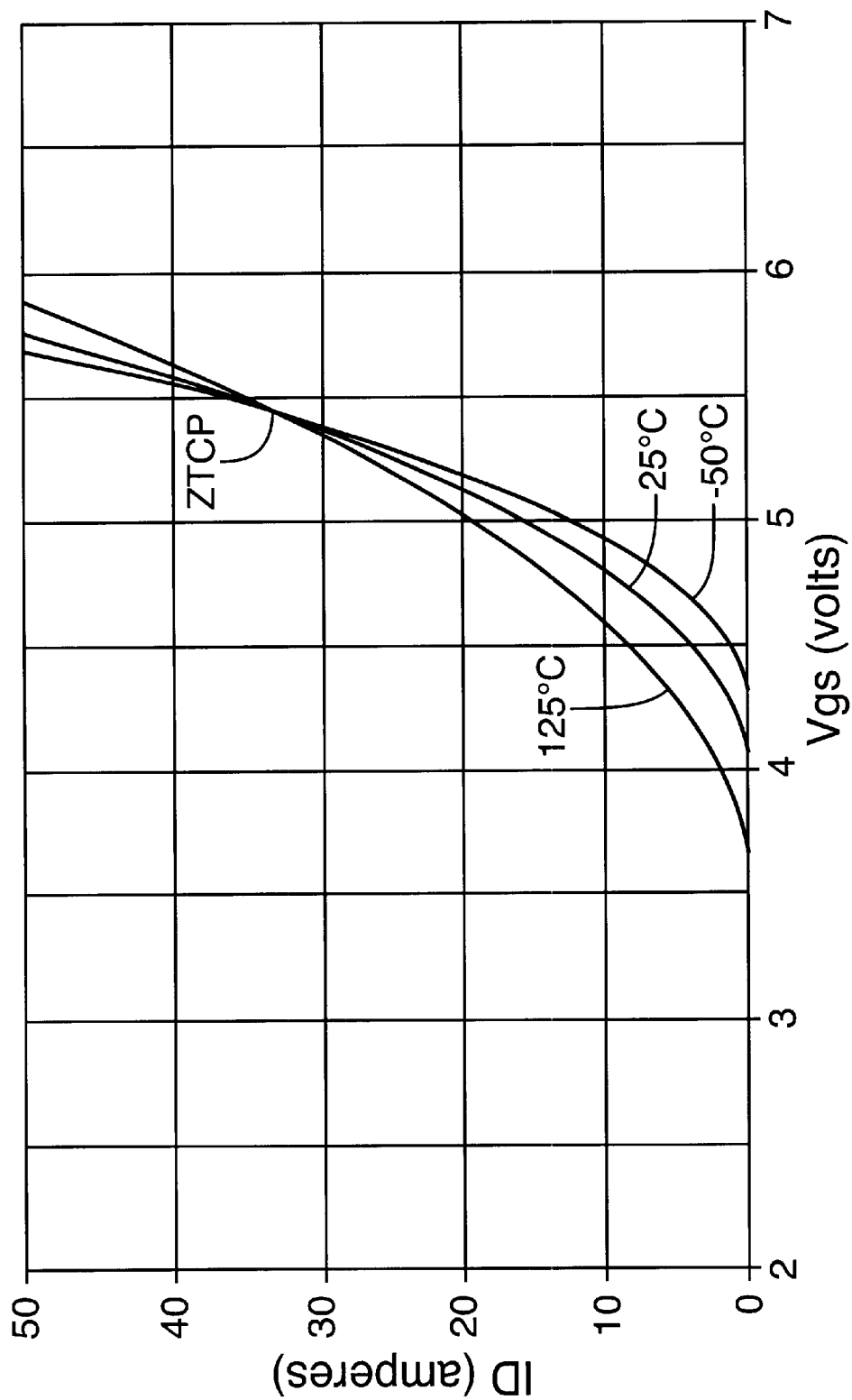
FIG. 2 is a graph of forward transfer characteristic for a typical power MOSFET plotted at three different temperatures (−50, 25 and 125 degrees Celsius).

The primary means for improving Safe Operating Area is to reduce its crossover or turnover current, this being the crossover current or ZTCP shown in FIG. 2, or the current at which slope is zero in a graph of gate voltage vs. junction temperature. By modifying the gate-source geometry using the asymmetric threshold characteristic described above, the crossover current can readily be reduced by half, with commensurate improvements in linear-mode FBSOA and usable power dissipation. The net effect is creation of two distributed parallel MOSFETs with different transfer characteristics. The portion of the die with the shorter channel length has a slightly lower gate threshold voltage $V_{th}$ and operates closer to zero temperature coefficient point than the longer channel. At low drain currents, the lower $V_{th}$ portion of the die dominates the current flow. Since this portion of the die is operating closer to the zero temperature coefficient point, hot spotting and subsequent thermal runaway is less likely to occur. At higher currents, the current sharing between the two portions of the channel becomes more uniform and operation approaches that of a device with a normal symmetrical channel structure. In this situation, usable FBSOA can be 50% higher than in a similar geometry switchmode device.

Having described and illustrated the principles of the invention in a preferred embodiment thereof, it should be apparent that the invention can be modified in arrangement and detail without departing from such principles. I claim all modifications and variation coming within the spirit and scope of the following claims.

What is claimed is:

1. A power MOSFET type device comprising:
   a substrate of a first dopant type;
   first and second gate structures disposed on a surface of the substrate and spaced apart thereon;
   a body region of a second dopant type formed in the substrate and having first and second spaced-apart channel regions respectively disposed subjacent the first and second gate structures;
   first and second source regions of the first dopant type formed in the body region; the first and second channel regions having different gate threshold voltage characteristics.

2. A power MOSFET type device according to claim 1 in which the first channel region has a gate threshold voltage characteristic sufficiently different from the gate threshold voltage characteristic of the second channel region to reduce zero temperature coefficient point (ZTCP) relative to a device having a single gate threshold voltage characteristic.

3. A power MOSFET type device according to claim 1 in which the first channel region has a gate threshold voltage characteristic sufficiently different from the gate threshold voltage characteristic of the second channel region to reduce variation in transconductance of the device as a function of temperature relative to a device having a single gate threshold voltage characteristic.

4. A power MOSFET type device according to claim 1 in which the first channel region has a doping concentration less than a doping concentration of the second channel region.

5. A power MOSFET type device according to claim 1 in which the first source region has a doping concentration greater than a doping concentration of the second source region.

6. A power MOSPET type device according to claim 1 in which the first and second gate structure each include a dielectric layer, the dielectric layer of the first gate structure having a thickness less than a thickness of the dielectric of the second gate structure.

7. A power MOSFET type device according to claim 1 having two or more channel regions having different gate threshold voltage characteristics.

8. A linear power circuit including a power MOSFET type device according to claim 1, further including an operational amplifier having a non-inverting input terminal for coupling to a control signal, an inverting input terminal coupled to a source terminal of the device to form a feedback loop, and an output terminal coupled to the gate structure of the device.

9. A linear power circuit according to claim 8 including a resistor coupling the source terminal of the device to a reference voltage.

10. A linear power circuit including at least two power MOSFET type devices according to claim 1 coupled in parallel, the circuit further including an operational amplifier coupled to each respective power MOSFET type device, each operational amplifier having a first input terminal for coupling to a control signal, a second input terminal coupled to a source terminal of the device, and an output terminal coupled to the gate structure of the respective power MOSFET type device.

11. A power MOSFET type device according to claim 1 in which the first and second channel regions are proportioned to produce a conduction characteristic substantially insensitive to temperature variations below the zero temperature coefficient point (ZTCP) for improved SOA capability.

12. A power MOSFET type device according to claim 11 in which the first and second channel regions having different gate threshold voltage characteristics are proportioned in size such that the second channel region is between about 5% and 50% of the total of the first and second channel regions.

13. A linear power circuit including a power MOSFET type device according to claim 12, further including an operational amplifier having a non-inverting input terminal for coupling to a control signal, an inverting input terminal coupled to a source terminal of the device to form a feedback loop, and an output terminal coupled to the gate structure of the device.

14. A linear power circuit according to claim 13 including a resistor coupling the source terminal of the device to a reference voltage.

15. A linear power circuit including at least two power MOSFET type devices according to claim 12 coupled in parallel, the circuit further including an operational amplifier coupled to each respective power MOSFET type device, each operational amplifier having a first input terminal for coupling to a control signal, a second input terminal coupled to a source terminal of the device, and an output terminal coupled to the gate structure of the respective power MOSFET type device.

16. A linear power circuit including a power MOSFET type device according to claim 11, further including an operational amplifier having a non-inverting input terminal for coupling to a control signal, an inverting input terminal coupled to a source terminal of the device to form a feedback loop, and an output terminal coupled to the gate structure of the device.

17. A linear power circuit according to claim 16 including a resistor coupling the source terminal of the device to a reference voltage.

18. A linear power circuit including at least two power MOSFET type devices according to claim 11 coupled in parallel, the circuit further including an operational amplifier coupled to each respective power MOSFET type device, each operational amplifier having a first input terminal for coupling to a control signal, a second input terminal coupled to a source terminal of the device, and an output terminal coupled to the gate structure of the respective power MOSFET type device.

19. A power MOSFET type device according to claim 1 in which the source regions, body region and a drawing region are configured to form a VDMOS device.

* * * * *

UNITED STATES PATENT AND TRADEMARK OFFICE
CERTIFICATE OF CORRECTION

PATENT NO. : 6,664,594 B2
DATED : December 16, 2003
INVENTOR(S) : Klodzinski

It is certified that error appears in the above-identified patent and that said Letters Patent is hereby corrected as shown below:

Column 4,
Line 15, "other.) FIG. 6" should read -- other.) ¶ FIG. 6 --.

Column 5,
Line 1, "$N_{A1}=NA_{A2}$," should read -- $N_{A1}=N_{A2}$, --.

Column 8,
Line 47, "volt is, preferred." should read -- volts is preferred. --.

Column 9,
Line 57, "power MOSPET type" should read -- power MOSFET type --.

Signed and Sealed this

Twenty-first Day of June, 2005

JON W. DUDAS
*Director of the United States Patent and Trademark Office*